(12) United States Patent
Johannessen

(10) Patent No.: US 7,064,705 B2
(45) Date of Patent: Jun. 20, 2006

(54) METHOD OF AND APPARATUS FOR INCREASING THE PEAK OUTPUT PULSE POWER DELIVERED BY CAPACITOR-DRIVEN HIGH-POWER DIODE AND SQUARE-LOOP SATURABLE REACTOR PULSE COMPRESSION GENERATORS WITH THE AID OF MINORITY CARRIER SWEEP-OUT CIRCUITS WITHIN THE PULSE COMPRESSION CIRCUIT

(75) Inventor: Paul Johannessen, Lexington, MA (US)

(73) Assignee: Allor Foundation

( * ) Notice: Subject to any disclaimer, the term of this patent is extended or adjusted under 35 U.S.C. 154(b) by 90 days.

(21) Appl. No.: 10/877,000

(22) Filed: Jun. 25, 2004

(65) Prior Publication Data

US 2005/0285779 A1    Dec. 29, 2005

(51) Int. Cl.
G01S 7/282     (2006.01)
(52) U.S. Cl. ............. 342/175; 342/201; 342/202; 342/204
(58) Field of Classification Search ............. 342/175, 342/201–204; 307/106–108, 86; 327/129; 331/167; 455/42, 107, 126, 127.1
See application file for complete search history.

(56) References Cited

U.S. PATENT DOCUMENTS

| 3,711,725 | A | * | 1/1973 | Johannessen | ............. 307/108 |
| 3,832,573 | A | | 8/1974 | Ver Planck et al. | |
| 3,889,263 | A | | 6/1975 | Johannessen | |
| 3,955,144 | A | * | 5/1976 | Dishal | ............. 375/295 |
| 4,001,598 | A | | 1/1977 | Johannessen | |
| 4,059,801 | A | * | 11/1977 | Johannessen et al. | ........ 375/304 |
| 4,151,528 | A | * | 4/1979 | Johannessen | ............. 342/389 |
| 4,191,992 | A | * | 3/1980 | Johannessen | ............. 363/50 |
| 4,230,995 | A | | 10/1980 | Burnham | |
| 4,674,022 | A | | 6/1987 | Ver Planck | |
| 5,105,196 | A | * | 4/1992 | Nolan et al. | ............. 342/389 |
| 5,734,544 | A | * | 3/1998 | Johannessen | ............. 361/205 |
| 5,952,735 | A | * | 9/1999 | Johannessen | ............. 307/106 |
| 5,969,439 | A | * | 10/1999 | Johannessen | ............. 307/106 |
| 6,928,265 | B1 | * | 8/2005 | Johannessen | ............. 455/42 |
| 2003/0214435 | A1 | * | 11/2003 | Johannessen | ............. 342/388 |
| 2005/0285779 | A1 | * | 12/2005 | Johannessen | ............. 342/175 |

OTHER PUBLICATIONS

"Analysis of CIC NPT IGBT's turn-off operations for high switching current level", Lefebvre, S.; Miserey, F.; Electron Devices, IEEE Transactions on vol. 46, Issue 5, May 1999 pp. 1042-1049.*

"Capacitor Coupled Inverter Regulator", G. A. Hellwarth; J. F. Holloway, Originally disclosed by IBM on Dec. 1, 1973, Loaded into the IP.com Prior Art Database on (Feb. 27, 2005), IPCOM000080353D, pp. 1-3.*

"The design of combined high power line type solid-state modulator", Zhang Jianhua; Sun Fangli; Yuan Tongshan; Yao Wusheng Radar, 2001 CIE International Conference on, Proceedings pp. 903-906.*

\* cited by examiner

*Primary Examiner*—John B. Sotomayor
(74) *Attorney, Agent, or Firm*—Rines and Rines

(57) ABSTRACT

A technique and apparatus for increasing the peak output pulse power of a capacitor driven high-power diode and square-loop saturable reactor pulse compression generator or transmitter (such as a Loran-C transmitter or other high power pulse generator) with the aid of a minority carrier sweep-out circuit interposed, within the pulse compression circuit.

10 Claims, 6 Drawing Sheets

METHOD OF AND APPARATUS FOR INCREASING THE PEAK OUTPUT PULSE POWER DELIVERED BY CAPACITOR-DRIVEN HIGH-POWER DIODE AND SQUARE-LOOP SATURABLE REACTOR PULSE COMPRESSION GENERATORS WITH THE AID OF MINORITY CARRIER SWEEP-OUT CIRCUITS WITHIN THE PULSE COMPRESSION CIRCUIT

FIELD

The present invention relates to high-power RF solid-state generators or transmitters wherein RF pulses are generated by means of magnetic pulse compression and pulse forming networks; the invention being more particularly, though not exclusively, concerned with SCR switching-controlled generators used for U.S. Coast Guard Loran-C navigation (and for similar transmitters) such as of the Accufix® type of Megapulse, Inc., the assignee of the present invention, the basic operational principles of which are described, for example, in my earlier U.S. Pat. Nos. 4,001,598; 3,832,573; and 3,889,263; and with techniques for increasing the peak output pulse power capability thereof.

BACKGROUND

Such pulse generators or transmitters basically embody SCR-controlled capacitor charging and displaying circuits driving square-loop saturable magnetic reactor pulse compression circuits comprising series-resonant circuits feeding an output RF transformer for energizing an antenna load to radiate RF pulses at the desired output frequency to which the series resonant circuit is tuned—100 kHz for a Loran-C transmitter.

Prior to the discovery of the present invention, the peak output power that could be so generated was limited, as later more fully explained, by the minority carrier charges stored in the solid-state junction of the pulse compression circuit high-power diode connected in series with the saturable reactor, being dissipated by the rapid build-up of reverse current as the reactor saturates. Heretofore, the possible peak output power was limited by the minority carriers in the high power diode and not by the actual power ratings of the capacitors and other circuit components, which were thus under-used in such pulse generators.

In accordance with the present invention, this limitation of high-power pulse output has been totally overcome and the full power ratings of the circuit components now made available for use, by the insertion of a novel type of minority carrier sweep-out circuits for the pulse compression circuit diode, and in a novel shunt position in the pulse compression circuit.

While the broad concept of minority carrier sweep-out networks for priming-loss reduction and for eliminating dissipated minority carrier sweep-out losses in the SCR junctions of SCR-controlled energy switching circuits has been used for many years by said assignee and others, as described in my prior U.S. Pat. No. 4,230,955 (and also in U.S. Pat. No. 4,674,022), the discovery has now been made that a novel configuration sweep-out circuit is possible for the minority carriers developed in the series solid-state diode itself of a pulse compression circuit, and that such use may now enable the employment of the full actual voltage and power ratings of the pulse generator circuit components, allowing substantially increased peak output power to be generated by the same transmitter.

OBJECTS OF INVENTION

It is accordingly a primary object of this invention to provide a new and improved method of and apparatus for obviating the RF peak output power limitations of prior solid-state generators as above described, and to enable the increasing of the peak output pulse power deliverable by capacitor-driven high-power diode and square-loop saturable reactor pulse compression generators through use of minority carrier sweep-out circuits for the pulse compression circuit high-power series diode of such circuit.

A further object is to provide such an improved apparatus in which the full power rating of the components of the pulse compression circuit now becomes usable for generating higher peak output pulses.

Other and further objects will be explained hereinafter and are more fully delineated in the appended claims.

SUMMARY

In summary, however, from one of its important aspects, the invention embraces in a radio-frequency pulse generator comprising a capacitor voltage-discharge-driven series-connected high power solid-state diode and square loop saturable magnetic reactor series-resonant pulse compression circuit for delivering-high voltage pulses to a load such as an antenna tuned to said radio frequency, a method of removing limitations on the use of the full voltage rating of said capacitor and thus on the peak power output of said pulse compression circuit caused by minority carrier charges stored in the solid-state diode junction at the time of reverse current saturation of said reactor during the series resonance of said circuit, that comprises, interposing a minority carrier sweep-out circuit in the pulse compression circuit, and adjusting the sweep-out circuit to produce a time of recovery of said diode less than said time of reverse current saturation of said reactor, thereby to eliminate said limitations and to permit the use of the full voltage rating of said capacitor to enable the increasing of said peak power output.

Preferred and best mode designs are later fully described.

DRAWINGS

The invention will now be described with reference to a preferred embodiment shown applied to a Loran-C type transmitter for purposes of illustration, and in which FIG. 1 presents a schematic circuit diagram of an improved pulse compression generator or transmitter using the present invention;

DESCRIPTION OF PREFERRED EMBODIMENT

Figure 1:
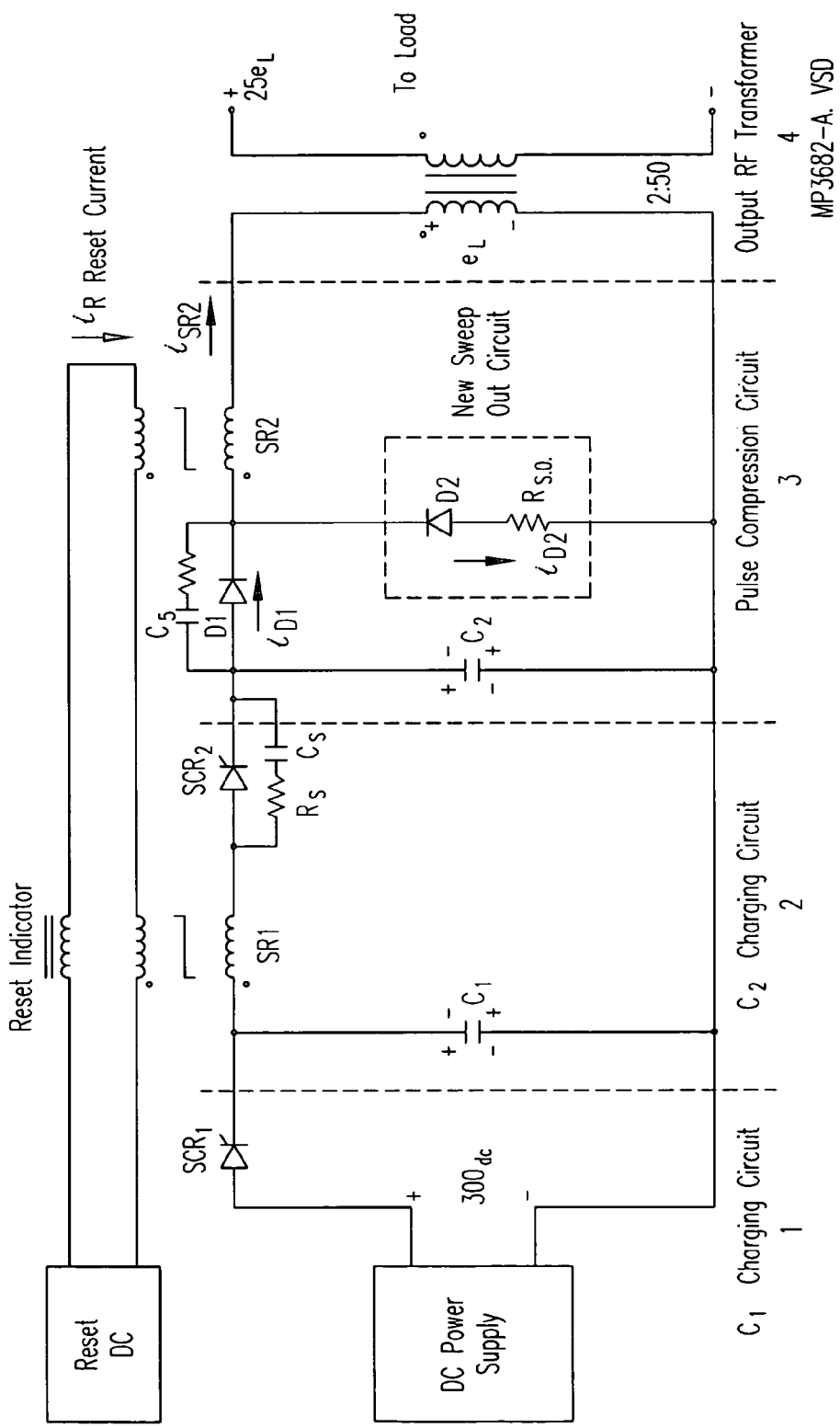

Referring to FIG. 1, the high-power pulse generator or transmitter with magnetic pulse compression is shown consisting of four basic parts labeled "$C_1$ Charging Circuit" 1, "$C_2$ Charging Circuit" 2, "Pulse Compression Circuit" 3, and "Output RF Transformer" 4. Voltage from a DC power supply, say of the order of 300 volts for the illustrative Loran-C transmitter application, charges the capacitor $C_1$ in response to the switching action of $SCR_1$. A first series saturable reactor SR1 and a second switching $SCR_2$, shown shunted by resistance $R_S$ and by capacitance $C_S$, serve as the second resonance-charging circuit 2 voltage doubler for capacitor $C_2$, as is well-known. The before-mentioned high-power solid-state diode D1 is then shown connected in series in the pulse compression circuit 3 as shunted by capacitor $C_5$ and resistance, and series-connected in a series-resonant circuit with a second square-loop saturable magnetic reactor SR2, driving the primary or left-hand winding of the output RF transformer 4, which is in turn coupled to a secondary step-up transformer winding (ratio 2:50) that energizes the ultimate load, such as a tuned transmitting antenna. A conventional reset circuit is shown coupled to each of the saturable reactors SR1 and SR2.

The operation of the system of FIG. 1 is as follows, referencing the illustrative waveforms and examples of FIGS. 2 and 3. At the start of the pulse generating process, (t=0 in FIG. 2), the voltages on $C_1$ and $C_2$ are negative and equal in magnitude. The charging of $C_1$ occurs in the time interval 0 to 150 μsec. This is followed by a time interval of 100 μsec. (150 to 250 μsec.) to allow $SCR_1$ to recover. At 250 μsec., SCR2 is turned on, triggering the discharge or transferring of the charge on $C_1$ to $C_2$ in the time interval 250 to 265 μsec. In this time-interval, the voltage on $C_2$ drives the square-loop saturable reactor SR2 from negative to positive saturation, which occurs at 265 μsec. Capacitor $C_2$ and the saturable reactor SR2 form the before-mentioned series-resonant circuit tuned to the desired output frequency; i.e. 100 kHz for a Loran-C transmitter antenna. Thus, a 15 μsec. current pulse ($i_{SCR2}$) of peak amplitude 3,300 amperes is converted into a 5 μsec. high current pulse of amplitude 10,000 amperes.

Figure 2:
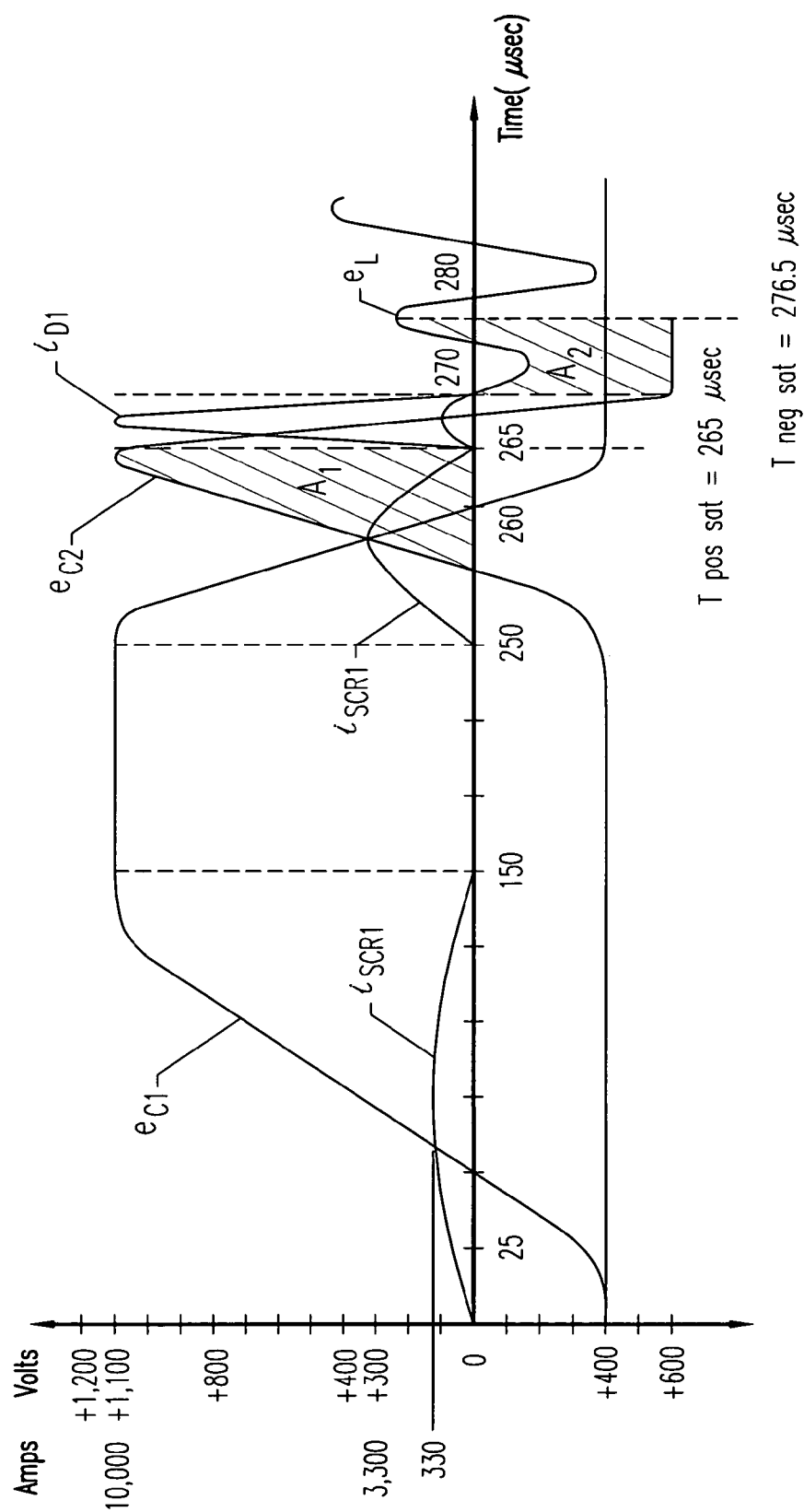
FIG. 2 is a graph illustrating the voltage and current waveforms developed in the operation of the circuit of FIG. 1.
Figure 3:
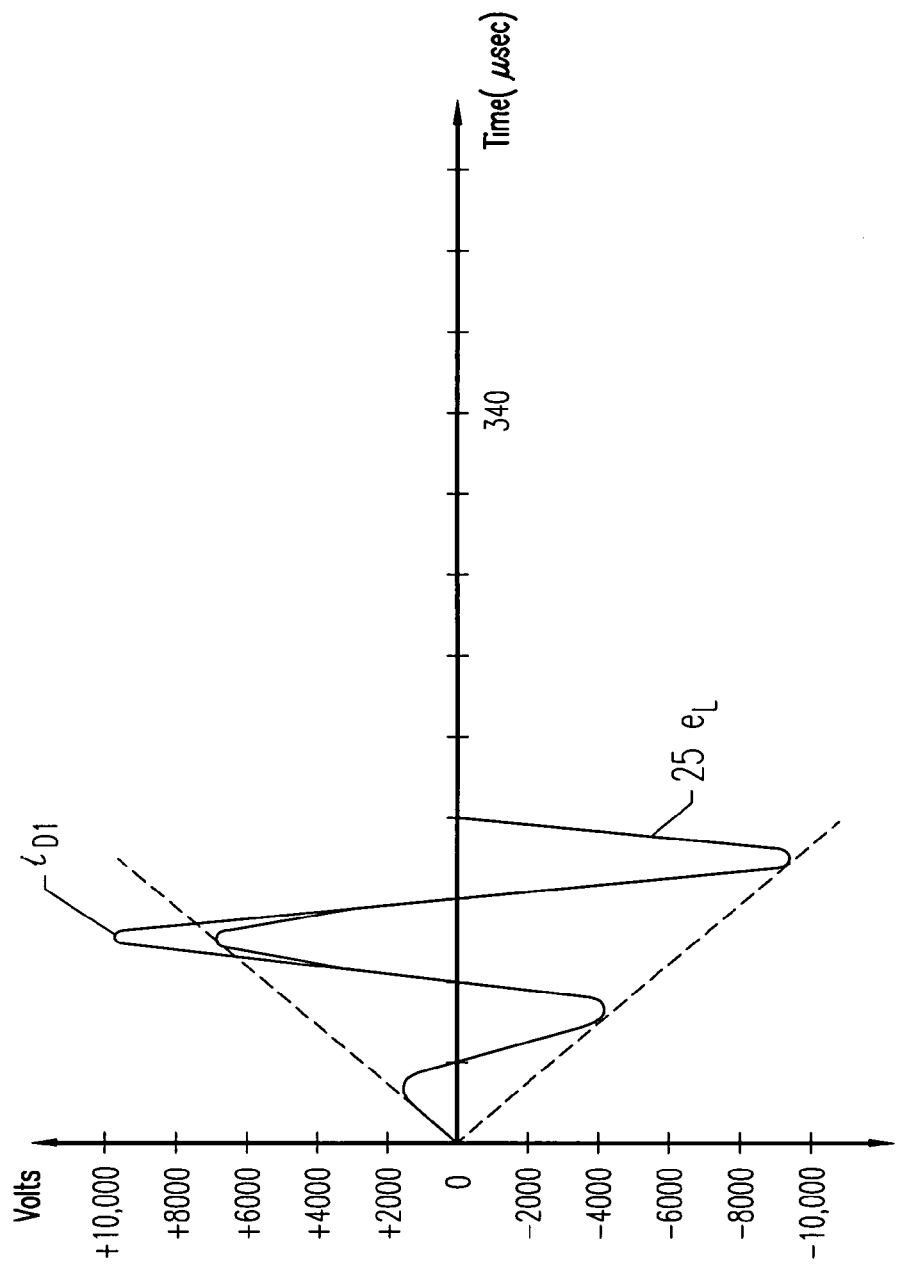
FIG. 3 is a graph showing high-power diode current developed in FIG. 1 and the resulting load voltage.

The shaded area labeled $A_1$ in FIG. 2, is the volt-time area that drives SR2 from negative to positive, with saturation occurring at time $T_{pos.sat} \cong 265$ μsec The shaded area labeled $A_2$ in FIG. 2 is the volt-time area that drives SR2 from positive to negative saturation. Since $A_1=A_2$, the time of negative saturation $T_{neg.sat}$, occurs at approximately 276.5 μsec. In the time interval between $T_{possat}$ and $T_{negsat}$, the SR2 current is very small, shown as $\Delta i_{SR\ 2}$ in FIGS. 4 and 5.

As earlier noted, the high-voltage series diode D1 will recover when all the minority carriers in the diode junction have been removed. Without the presence of the saturable reactor SR2 in series with the diode D1, the reverse recovery current of D1 would be that shown as the dotted curve in FIG. 5. The current-time area labeled $Q_1$ in FIG. 5 is the minority carrier charge stored in the junction.

Figure 4:
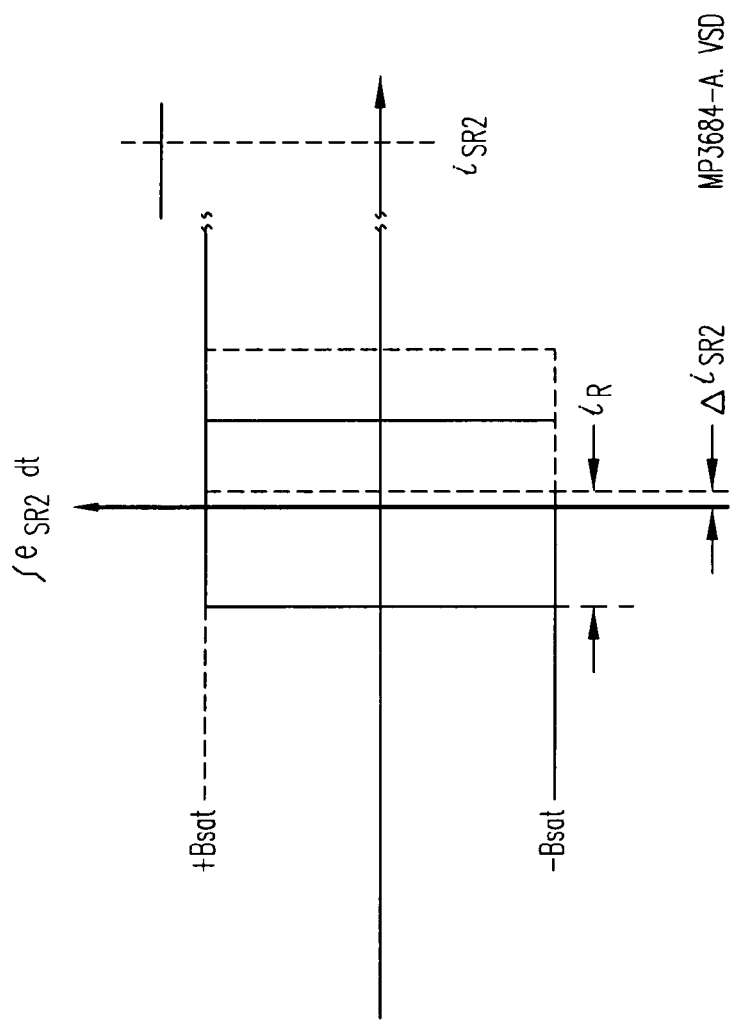
FIG. 4 is a waveform diagram illustrating the saturable reactor square-loop electrical characteristics in the pulse compression circuit of FIG. 1.
Figure 5:
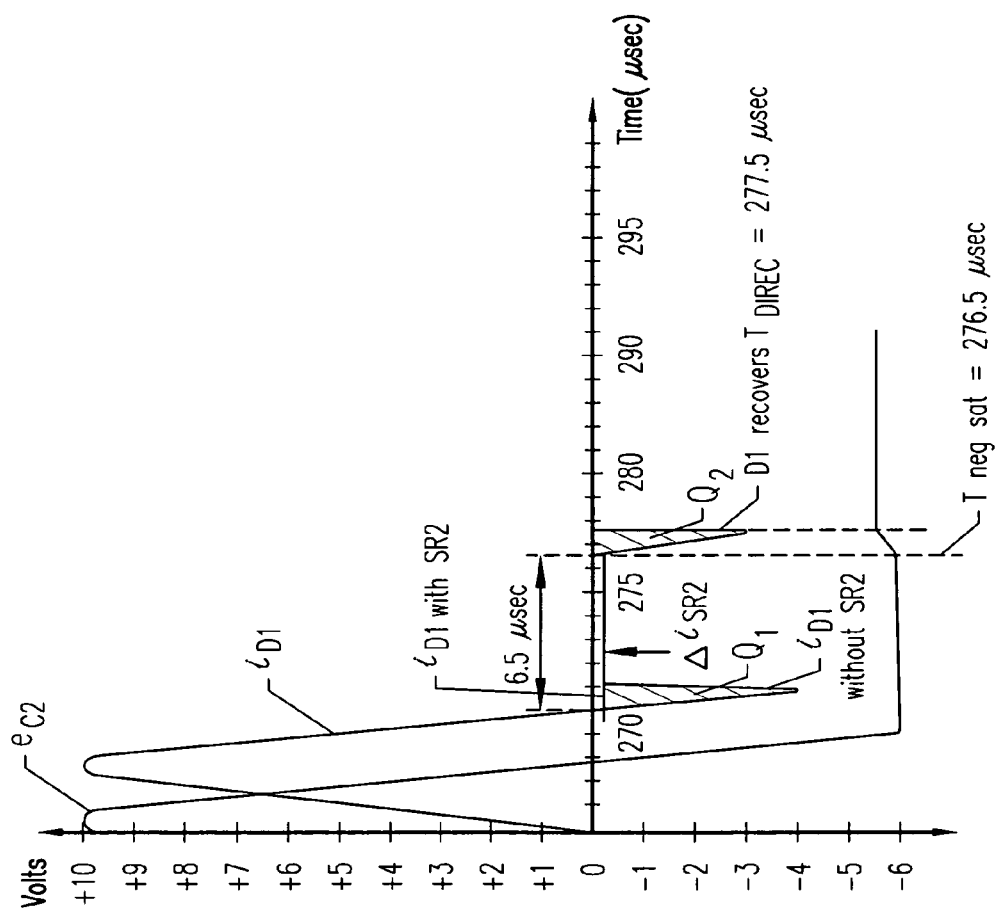
FIGS. 5 and 6 contrast the voltage and current waveforms developed in the absence of the use of the sweep-out circuit of the present invention in the pulse compression circuit, and with the use of such sweep-out circuit, respectively.

With SR 2 in series with D1, on the other hand, as shown, the reverse current is limited to a small, $\Delta i_{SR\ 2}$, as shown in FIGS. 4 and 5. This small value of reverse current lasts until SR2 saturates in the reverse direction, which, for the above example, occurs at $T_{neg.sat} \cong 276.5$ μsec.

At such time, the reverse current builds up rapidly until the stored minority carriers have been swept out, such occurring when the shaded area $Q_2$ is equal to $Q_1$ at time $T_{D1Rec} \cong 277.5$ μsec.

A large reverse current spike is generated, however, as shown in FIG. 5. This could cause overheating and voltage breakdown of the diode D1. To prevent this from happening, the diode D1 must recover before the reactor SR2 saturates. Thus, $T_{D1Rec} < T_{neg.sat}$ In the past, to satisfy this inequality, $T_{neg.sat}$ has been increased by decreasing the $C_2$ reverse voltage. This decrease has been obtained by lowering the $C_2$ forward voltage. Thus, an upper limit has been set on the $C_2$ forward voltage. Typically, in the above example, this voltage limit is 800 volts, and this, in turn, has limited the peak output pulse power.

In accordance with the present invention, this inequality is satisfied in a very different way; namely, by decreasing $T_{D1Rec}$ through inserting a "minority carrier sweep-out circuit" consisting of the series interconnection of a diode D2 and a resistor $R_S$, shown in FIG. 1 as connected in shunt in the pulse compression circuit 3 from the point of series connection of D1 and SR2 to the bottom terminal of the primary winding of the step-up output transformer 4.

Figure 6:
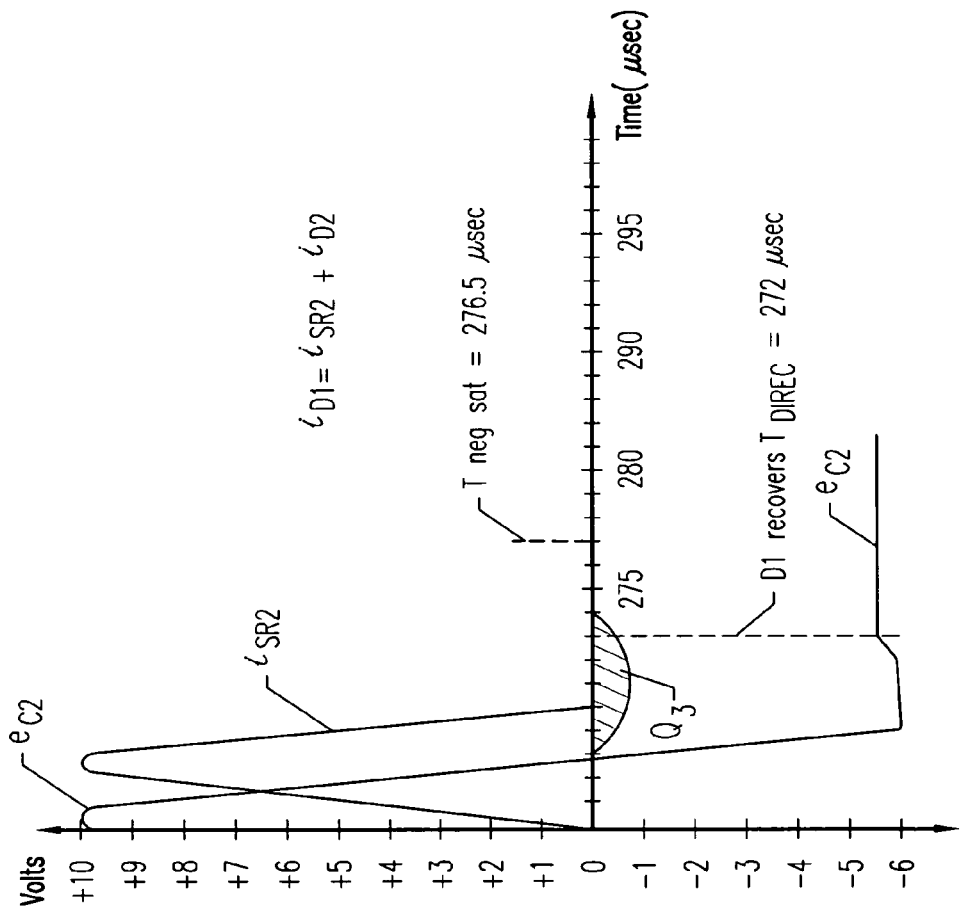

The voltage and current waveforms of this sweep-out circuit are shown in FIG. 6. The current $i_{D2}$ sweeps out the minority carrier charge in diode D1 as shown by the shaded area $Q_3$ in FIG. 6. The diode D1 recovers when the area $Q_3$ becomes equal to the area $Q_2$ in FIG. 5. As seen from FIG. 6, the time of the recovery of the diode D1 is approximately $T_{D1Rec} \cong 272$ μsec.

Since the negative saturation of SR2 occurs at 276.5 μsec., the before-stated inequality $T_{D1Rec} < T_{neg.sat}$ is thus satisfied.

The incorporation of this "sweep-out circuit" has now made it possible to increase the voltage used on capacitor $C_2$ from 800 volts to 1000 volts. Thus, the output power of the transmitter has now been substantially increased, in this case by a factor of $$\left(\frac{1,000}{800}\right)^2 = 1.56.$$

The invention, of course, is not limited to the illustrative Loran-C configuration and exemplary values presented, but, as before indicated, are useful in other applications, as well. Further modifications, indeed, will occur to those skilled in this art, and such are considered to fall within the spirit and scope of the invention as defined in the appended claims.

What is claimed is:

1. In a radio-frequency pulse generator comprising a capacitor voltage-discharge-driven series-connected high power solid-state diode and square loop saturable magnetic reactor series-resonant pulse compression circuit for delivering high voltage pulses to a load such as an antenna tuned to said radio frequency, a method of removing limitations on the use of the full voltage rating of said capacitor and thus on the peak power output of said pulse compression circuit caused by minority carrier charge stored in the solid-state diode junction at the time of reverse current saturation of said reactor during the series resonance of said circuit, that comprises, interposing a minority carrier sweep-out circuit in the pulse compression circuit; and adjusting the sweep-out circuit to produce a time of recovery of said diode less than said time of reverse current saturation of said reactor, thereby to eliminate said limitations and to permit the use of the full voltage rating of said capacitor to enable the increasing of said peak power output.

2. The method of claim 1 wherein said interposing comprises connecting a diode-resistor circuit in shunt across the pulse compression circuit from the point of series connection of said solid-state diode and said reactor.

3. A radio-frequency pulse generator apparatus having, in combination, a triggerable capacitor voltage-discharge circuit; a series-resonant high power solid-state diode and square-loop saturable magnetic reactor pulse compression circuit connected to be energized by the discharge of said capacitor circuit and to produce opposite polarity reactor saturation during the series resonance; an output load connected to the pulse compression circuit and tuned to the radio frequency of the series resonance thereof; a diode minority carrier sweep-out circuit interposed in the pulse compression circuit; the sweep-out circuit being adjusted to enable a time of recovery of said diode after conduction that is less than the time of reverse current saturation of said reactor.

4. The apparatus of claim 3 wherein the minority carrier sweep-out circuit comprises a series-connected diode and resistance connected in shunt across the pulse compression circuit from the point of series connection of said high power solid-state diode and said saturable reactor.

5. The apparatus of claim 3 wherein said output load is an antenna tuned to the radio frequency of said series resonance of the pulse compression circuit.

6. The apparatus of claim 5 wherein the pulse compression circuit is connected to said antenna by a radio-frequency step-up transformer.

7. The apparatus of claim 6 wherein said apparatus is a Loran-C radio frequency transmitter in which said series resonance and output antenna tuning are both at a radio frequency of substantially 100 kHz.

8. The apparatus of claim 7 wherein said Loran-C transmitter further comprises a first SCR-triggerable capacitor d.c. charging circuit connected to a second SCR-triggerable saturable reactor charging circuit for energizing said capacitor voltage-discharge circuit.

9. The apparatus of claim 8 wherein said sweep-out circuit is adjusted to enable recovery of the high-voltage diode at about 272 μsec. after the start of the pulse generating, and the time of the reverse or negative square-loop magnetic reactor saturation is at about 276.5 μsec.

10. The apparatus of claim 9 wherein the time of the forward or positive reactor saturation is about 265 μsec.

* * * * *

UNITED STATES PATENT AND TRADEMARK OFFICE
CERTIFICATE OF CORRECTION

PATENT NO. : 7,064,705 B2  Page 1 of 1
APPLICATION NO. : 10/877000
DATED : June 20, 2006
INVENTOR(S) : Johannessen It is certified that error appears in the above-identified patent and that said Letters Patent is hereby corrected as shown below:

On the title page: Item [73] Assignee , Column 1 should read -- Megapulse, Inc. --

Signed and Sealed this

Twelfth Day of September, 2006

JON W. DUDAS
*Director of the United States Patent and Trademark Office*